(12) United States Patent
Lee

(10) Patent No.: US 6,625,836 B1
(45) Date of Patent: Sep. 30, 2003

(54) APPARATUS AND METHOD FOR CLEANING SUBSTRATE

(75) Inventor: Lim Su Lee, Daegu (KR)

(73) Assignee: LG. Philips LCD Co., Ltd., Seoul (KR)

( * ) Notice: Subject to any disclaimer, the term of this patent is extended or adjusted under 35 U.S.C. 154(b) by 38 days.

(21) Appl. No.: 09/689,839

(22) Filed: Oct. 13, 2000

(30) Foreign Application Priority Data

Oct. 14, 1999 (KR) .......................................... 1999-44599

(51) Int. Cl.[7] .............................................. A47L 15/00
(52) U.S. Cl. .............................. 15/77; 15/21.1; 15/88.3; 15/102
(58) Field of Search .......................... 15/21.1, 77, 88.2, 15/88.3, 102

(56) References Cited

U.S. PATENT DOCUMENTS

| | | | | |
|---|---|---|---|---|
| 4,326,553 A | * | 4/1982 | Hall | |
| 5,351,360 A | * | 10/1994 | Suzuki | |
| 5,651,160 A | * | 7/1997 | Yonemizu | |
| 5,868,857 A | * | 2/1999 | Moinpour | |
| 5,868,866 A | * | 2/1999 | Maekawa | |
| 5,901,399 A | * | 5/1999 | Moinpour | |
| 5,906,687 A | * | 5/1999 | Masui | |
| 5,937,469 A | * | 8/1999 | Culkins | |
| 5,966,765 A | * | 10/1999 | Hamada | |
| 6,058,544 A | * | 5/2000 | Motoda | |
| 6,079,073 A | * | 6/2000 | Maekawa | |
| 6,101,656 A | * | 8/2000 | Lee et al. | |
| 6,167,583 B1 | * | 1/2001 | Miyashita | |
| 2001/0010103 A1 | * | 8/2001 | Konishi | |

FOREIGN PATENT DOCUMENTS

JP 0143634 * 7/1985

* cited by examiner

*Primary Examiner*—Randall E. Chin
(74) *Attorney, Agent, or Firm*—McKenna Long & Aldridge LLP

(57) ABSTRACT

A substrate cleaning apparatus and method for a liquid crystal display panel capable of removing foreign substances attached to the lower and upper surfaces of a substrate as well as onto the side surface thereof. The apparatus includes upper and lower cleaning modules arranged in such a manner as to contact the upper and lower surfaces of the substrate. Also, a side-cleaning module is arranged at the side surfaces of the substrate.

9 Claims, 2 Drawing Sheets

APPARATUS AND METHOD FOR CLEANING SUBSTRATE

This application claims the benefit of Korean Patent Application No. 1999-44599, filed on Oct. 14, 1999, which is hereby incorporated by reference.

BACKGROUND OF THE INVENTION

1. Field of the Invention

The present invention relates to a liquid crystal display, and more particularly, to a substrate cleaning technique for a liquid crystal display.

2. Discussion of the Related Art

Generally, a liquid crystal display (LCD) panel is manufactured by carrying out various processes such as a process of forming a thin film transistor (TFT) including an electrode material, a semiconductor layer and an insulating film on a substrate, an assembling of the lower substrate to the upper substrate and an injection and sealing of liquid crystal, etc. In such various fabrication process of the LCD panel, particles such as substrate fragments, and various alien or foreign substances occasionally stick or adhere to the substrate to contaminate the substrate. In order to reduce such a defect caused by the foreign substances, a fabrication process of the LCD panel includes a substrate cleaning process for each step thereof. In connection with each fabrication process requiring cleaning of the substrate, the substrate cleaning is performed in the following: (1) before and after a step of forming a TFT array on the substrate; (2) after a step of forming an orientation film and rubbing the orientation film for forming an orientation of a liquid crystal; (3) after a step of scribing for assembling the upper substrate with the lower substrate and then cutting away each panel from the whole substrate; and (4) after a step of injecting a liquid crystal to the panel and sealing the injected portion.

Such substrate cleaning is carried out by means of a substrate-cleaning module, as shown in FIG. 1. Referring to FIG. 1, the conventional substrate cleaning apparatus includes cleaning brushes 22 for cleaning the upper and lower surfaces of a substrate 20. A pair of cleaning brushes 22 is provided at each of the upper and lower sides in such a manner as to contact the upper and lower surfaces of the substrate 20. As shown in FIG. 1, the cleaning is initiated by passing the substrate 20 between the upper and lower cleaning brushes 22 in the direction of the arrow. Then, the cleaning brushes 22 are rotated at a high speed to remove undesired particles and foreign substances sticking to the upper and lower surfaces of the substrate 20.

In the conventional substrate cleaning apparatus, the cleaning brushes 22 are formed to contact the upper and lower surfaces of the substrate 20 to remove foreign substances sticking to the upper and lower surfaces of the substrate 20. However, the conventional substrate cleaning apparatus cannot remove foreign substances adhering to the side surfaces of the substrate 20. The substrate 20 used in the liquid crystal display panel has a thickness of about 0.7 mm and is susceptible of being contaminated by such foreign substances due to the significant surface area of the side surfaces. Thus, foreign substances generated in various processes during fabrication of the panel become attached to the upper and lower surfaces of the substrate 20 as well as to the side surfaces thereof. Particularly, in the scribing or grinding process, minute particles and fragments of the substrate may adhere to the side surfaces of the substrate 20 to contaminate the substrate 20. This is because in the scribing process, each panel is separated from the large glass substrate by cutting after the formation of the TFT and assembling of the upper substrate to the lower substrate and in the grinding process, the coarse side surfaces of the substrate 20, after being separated, undergo grinding. Such foreign substances sticking to the side surfaces of the substrate 20 cause defects during fabrication of the panel to reduce throughput (yield) and deteriorate the picture quality of the LCD panel.

SUMMARY OF THE INVENTION

Accordingly, the present invention is directed to an apparatus and a method for cleaning a substrate that substantially obviates one or more of the problems due to limitations and disadvantages of the related art.

An object of the present invention is to provide a substrate cleaning apparatus and method for a liquid crystal display panel that is capable of removing foreign substances attached to the lower and upper surfaces of a substrate as well as to the side surfaces thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate cleaning apparatus for a liquid crystal display panel according to one aspect of the present invention includes a side-cleaning module arranged at a side surface of the substrate.

In another aspect of the present invention, a method of cleaning a substrate in a liquid crystal display panel includes rotating side cleaning brushes arranged in such a manner as to contact the side surface of the substrate to remove foreign substances sticking to the side surface of the substrate; rotating upper and lower cleaning brushes arranged in such a manner as to contact the upper and lower surfaces of the substrate, respectively, to remove foreign substances sticking to the upper and lower surfaces of the substrate; and jetting cleaning water carrying ultrasonic waves onto the side surface of the substrate at a high pressure to clean the side surface of the substrate.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, example of which is illustrated in the accompanying drawings.

Figure 1:
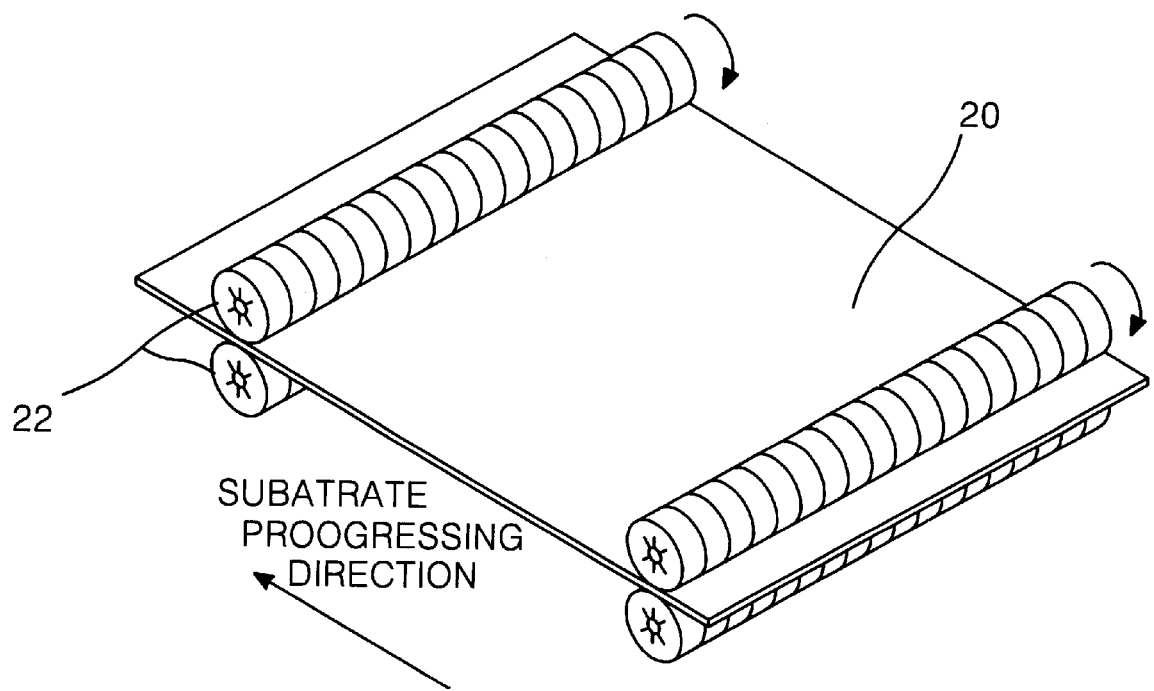
FIG. 1 is a perspective view showing a conventional substrate cleaning apparatus.
Figure 2:
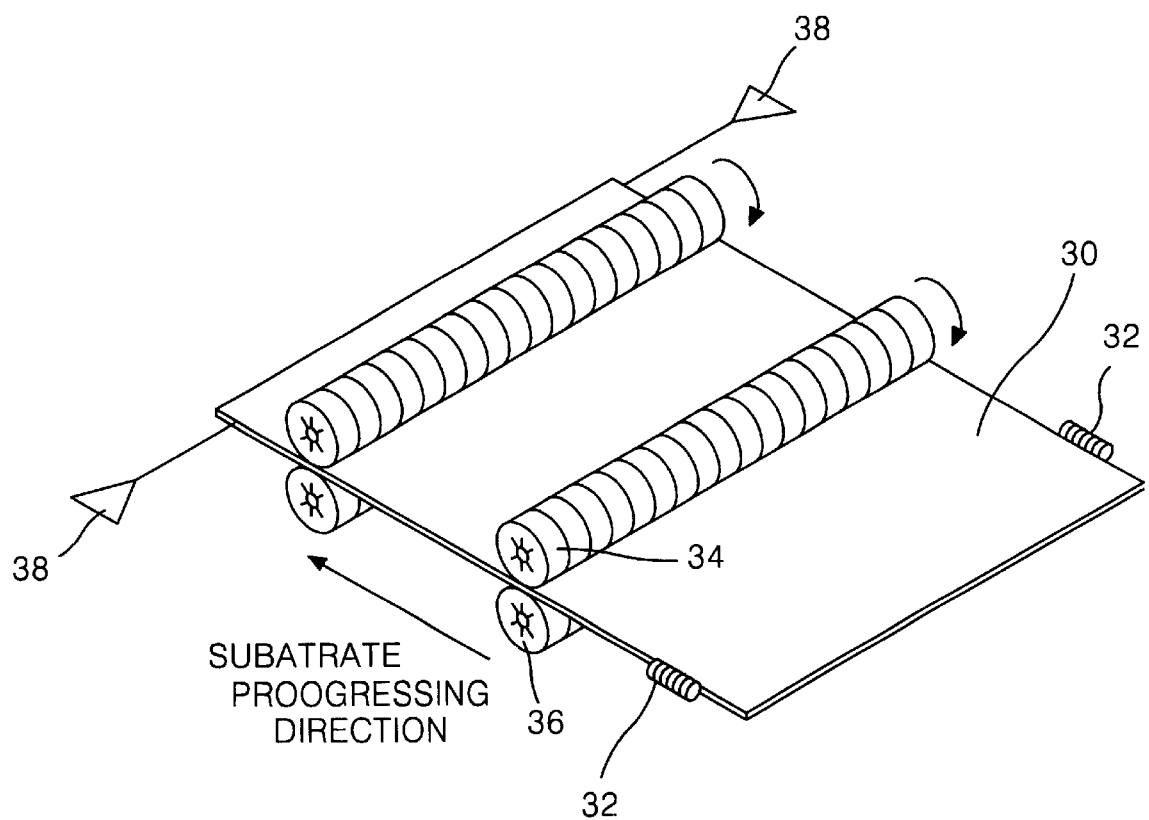
FIG. 2 is a perspective view showing a substrate cleaning apparatus according to an embodiment of the present invention.

Referring to FIG. 2, there is shown a substrate cleaning apparatus according to an embodiment of the present invention. The substrate cleaning apparatus includes upper cleaning brushes 34 and lower cleaning brushes 36 for cleaning the upper and lower surfaces of a substrate 30, respectively, as well as side cleaning brushes 32 and a sonar (e.g., Fine DI Mega Sonic) 38 for cleaning the side surface of the substrate 30. The side cleaning brushes 32 mounted on the side surface of the substrate 30 rotate to remove foreign substances sticking to the side surfaces of the substrate. Also, the sonar 38 jets or sprays cleaning water carrying ultrasonic waves onto the side surfaces of the substrate 30 at a high pressure to remove foreign substances sticking to the side surface of the substrate 30.

Hereinafter, an operation of the present substrate cleaning apparatus will be described. First, the substrate 30 is transferred and mounted between the upper and lower cleaning brushes 34 and 36 to move in the direction of the arrow shown in FIG. 2. In this case, the side cleaning brushes 32 and the sonar 38 are mounted within the cleaning module in such a manner as to contact the side surfaces of the substrate 30. As the substrate 30 begins to move, the side cleaning brushes 32 contacting the side surface of the substrate 30 are rapidly rotated to primarily remove foreign substances sticking to the side surface of the substrate 30. Next, while the substrate 30 is being transferred continuously, the upper and lower cleaning brushes 34 and 36 are rapidly rotated to remove foreign substances sticking to the upper and lower surfaces of the substrate 30. Finally, the sonar 38 jets or sprays cleaning water at a high pressure onto the side surfaces of the substrate 30 to further clean the side surfaces of the substrate 30. The cleaning water jetted from a fine nozzle of the sonar 38 is de-ionized water and carries ultrasonic waves causing a minute vibration. Accordingly, the foreign substances adhering to the side surfaces of the substrate 30 are preferably completely removed by the high pressure of the cleaning water and the vibration from the ultrasonic waves.

By such cleaning technique using the side-cleaning module, the substrate cleaning apparatus of the present invention can completely remove sticking particles or foreign substances sticking to the upper and lower surfaces of the substrates are removed by the upper and lower cleaning brushes, not the side brushes. Accordingly, a defect ratio caused by the foreign substances during fabrication of the LCD panel is dramatically reduced to improve yield. Moreover, picture quality deterioration caused by the foreign substances at the side surfaces of the substrate as in the prior art can be eliminated.

As described above, according to the present invention, sticking particles or foreign substances sticking to the upper and lower surfaces of the substrate as well as the side surfaces of the substrate are removed by the side brushes contacting the side surfaces of the substrate and a device for jetting or spraying cleaning water carrying ultrasonic waves at a high pressure. Accordingly, the fabrication yield of the LCD panel is improved and picture quality deterioration problem is solved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A substrate cleaning apparatus for cleaning a substrate of a liquid crystal display panel comprising:

a first cleaning module on a substrate, said substrate having upper and lower surfaces; and a side-cleaning module at a side surface of the substrate, said side-cleaning module having a water jet device jetting deionized water into the side surface of the substrate, wherein the side-cleaning module includes cleaning brushes that extends partially along the side surface of the substrate and wherein the substrate is transferred continuously in a linear direction.

2. The apparatus of claim 1, wherein the cleaning brushes of the side-cleaning module are rotatable.

3. The apparatus of claim 1, wherein the water jet device generates ultrasonic waves onto the side surface of the substrate.

4. The apparatus of claim 1, wherein the water jet device generates ultrasonic waves onto the side surface of the substrate at a high pressure.

5. The apparatus of claim 1, wherein the side-cleaning module comprises a vibration generating device.

6. The apparatus of claim 5, wherein the vibration generating device includes a sonar.

7. The apparatus of claim 5, wherein the vibration generating device generates ultrasonic waves onto the side surface of the substrate.

8. The apparatus of claim 5, wherein the vibration generating device jets water onto the side surface of the substrate.

9. The apparatus of claim 1, wherein the first-cleaning module includes cleaning brushes.

* * * * *